United States Patent
Noguchi et al.

(10) Patent No.: US 7,257,323 B2
(45) Date of Patent: Aug. 14, 2007

(54) SIGNAL-OFF DETECTION CIRCUIT AND OPTICAL RECEIVING DEVICE USING THE SAME

(75) Inventors: Hidemi Noguchi, Tokyo (JP); Tetuo Tateyama, Tokyo (JP); Madoka Kimura, Miyagi (JP)

(73) Assignee: NEC Corporation, Tokyo (JP)

( * ) Notice: Subject to any disclaimer, the term of this patent is extended or adjusted under 35 U.S.C. 154(b) by 833 days.

(21) Appl. No.: 10/292,434

(22) Filed: Nov. 13, 2002

(65) Prior Publication Data

US 2003/0094975 A1 May 22, 2003

(30) Foreign Application Priority Data

Nov. 21, 2001 (JP) ............................. 2001-355447

(51) Int. Cl.
- H04B 10/08 (2006.01)
- H04B 17/00 (2006.01)
- G01R 19/00 (2006.01)
- H03K 5/19 (2006.01)
- H03D 1/00 (2006.01)

(52) U.S. Cl. ..................... 398/24; 398/17; 398/151; 327/18; 327/20; 370/242; 375/338

(58) Field of Classification Search .............. 398/17, 398/24, 151; 370/242; 375/338, 339; 327/18–20
See application file for complete search history.

(56) References Cited

U.S. PATENT DOCUMENTS 5,138,636 A * 8/1992 Bardin ..................... 375/357

2003/0094967 A1 * 5/2003 Noguchi et al. ............ 324/765

FOREIGN PATENT DOCUMENTS

| JP | 60-181947 | 12/1985 |
| JP | 62-277835 | 12/1987 |
| JP | 3-267833 | 11/1991 |
| JP | 5-30091 | 2/1993 |
| JP | 5-91148 | 4/1993 |
| JP | 09-130330 | * 5/1997 |
| JP | 9-331363 | 12/1997 |
| JP | 2000-237681 | 9/2000 |
| JP | 2001-237681 | * 8/2001 |

* cited by examiner

*Primary Examiner*—Jason Chan
*Assistant Examiner*—Nathan Curs
(74) *Attorney, Agent, or Firm*—Young & Thompson

(57) ABSTRACT

This invention offers a signal-off detection circuit allowing arbitrary setting of an issuing time (response time) of a signal disconnection alarm without being affected by a time constant of a direct current feedback circuit giving an offset voltage to an amplifier for amplifying a data signal. Input data signals per a fixed time determined by a timer is counted by a counter, and a count value is compared with a predetermined set value in a comparator. A configuration is made such that a signal disconnection alarm may be issued by detecting a disconnection state of the data signal according to a comparison result. Thereby, an issuing time of a signal disconnection alarm can be set without being affected by a time constant of a direct current feedback circuit giving an offset voltage to an amplifier for amplifying a data signal of a preceding stage.

7 Claims, 12 Drawing Sheets

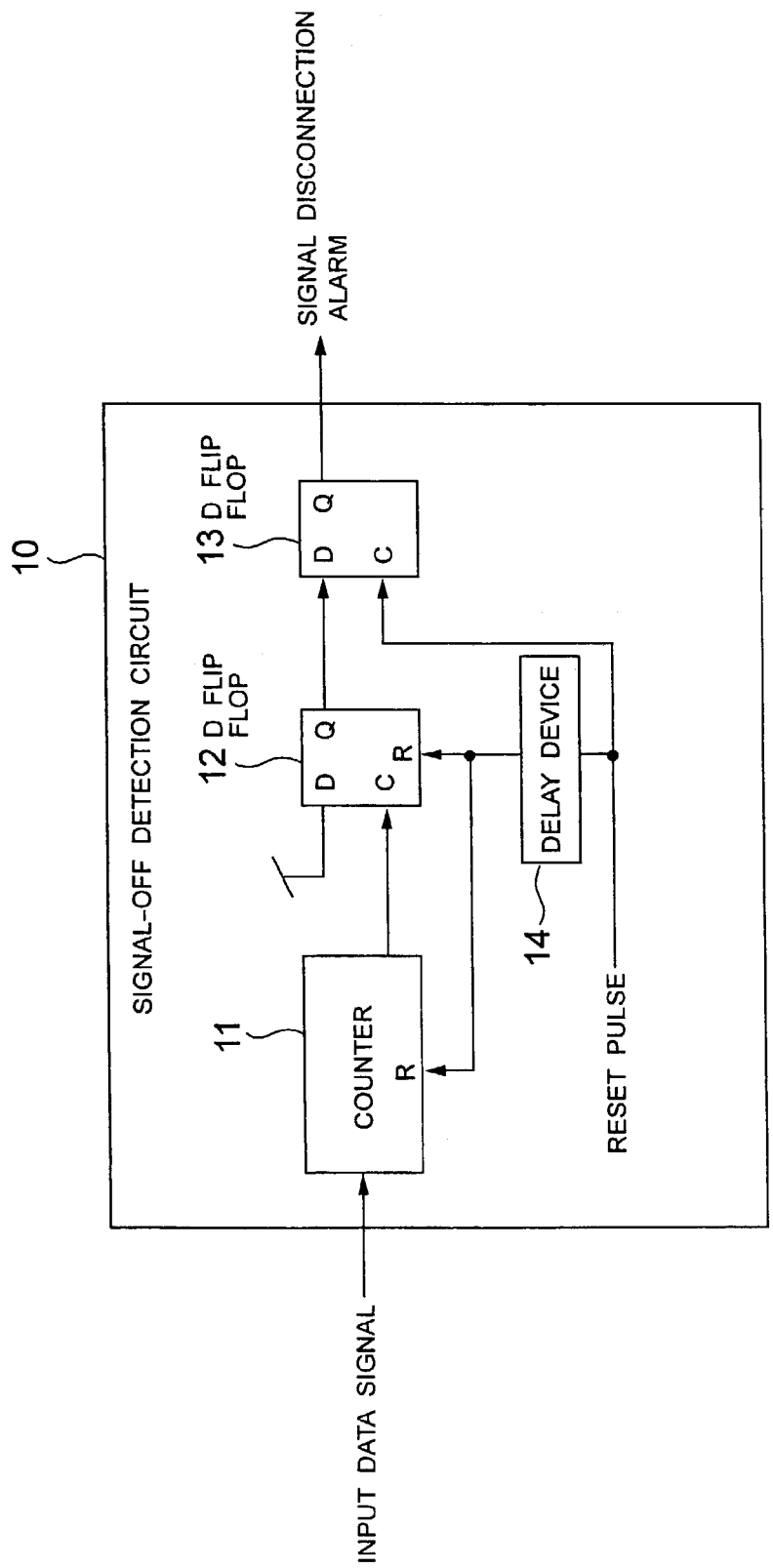

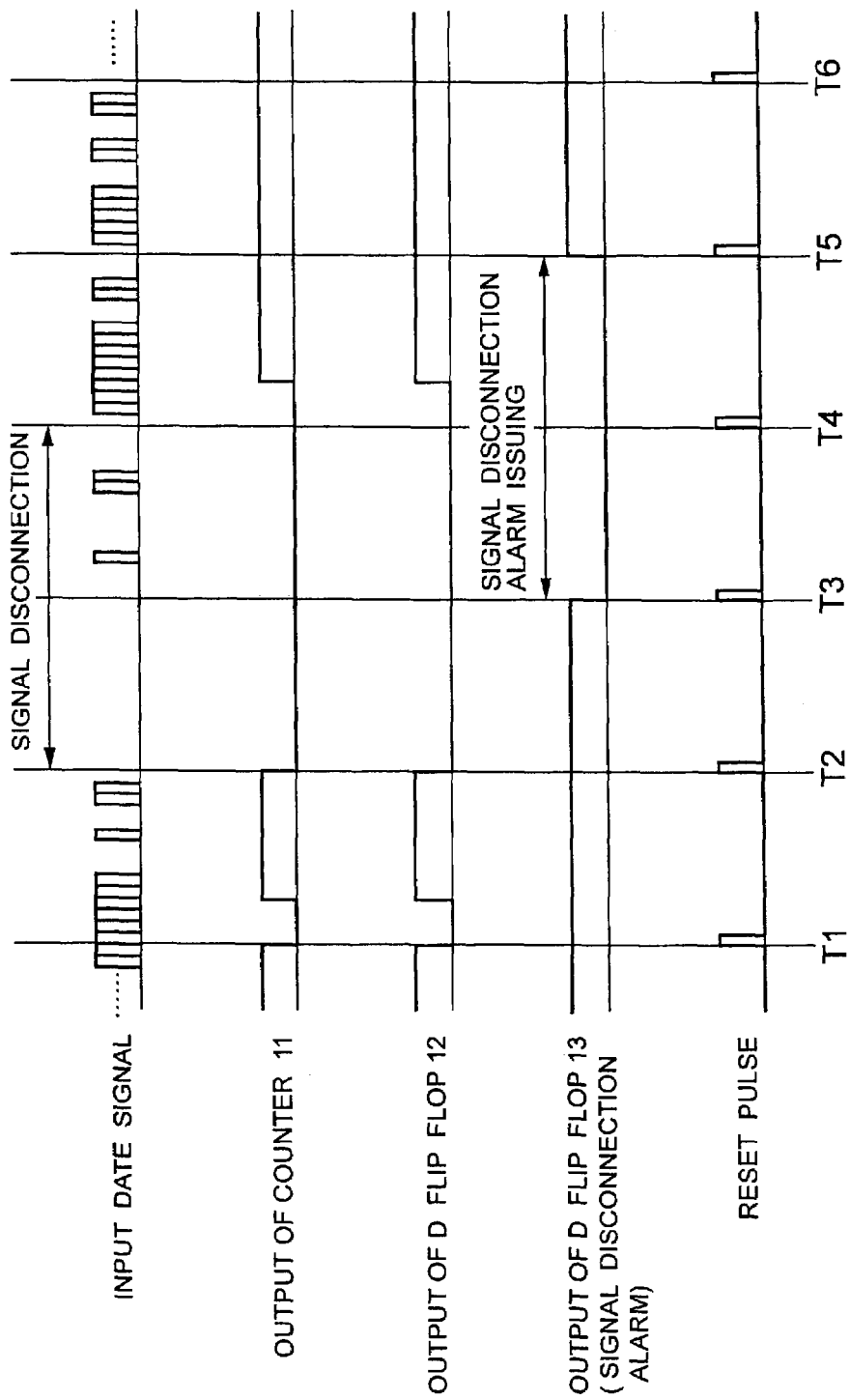

SIGNAL-OFF DETECTION CIRCUIT AND OPTICAL RECEIVING DEVICE USING THE SAME

BACKGROUND OF THE PRESENT INVENTION

1. Field of the Present Invention

The present invention relates to a signal-off detection circuit and an optical receiving device using the detection circuit and, in particular, to improvement of a signal-off detection circuit used in optical receiving devices.

2. Description of the Prior Art

When data signals to an optical receiving device are disconnected, that is, in the case of a break in the optical fiber and in the case of a failure of OFA (Optical Fiber Amplifier) in a WDM (Wave Length Division Multiplex) scheme, a function detecting a transmission line failure and issuing an alarm (LOS: Loss Of Signal) is required for isolating a failure to a transmission line failure and a device failure. Thus, this function is prescribed as an essential function by ITU (International Telecommunication Union).

When this alarm is issued, the system checks the operating state of its opposite device and performs operations such as switching the transmission line to a standby system (such an operation control is performed by a network management system of each device). After that, when all abnormal conditions have been resolved, the network management system checks communication to and from the opposite device and switches back from the standby system to the current use system. In this way, the alarm signal basically acts as a trigger for carrying out automatic switching between the system and the opposite device, and thus reliable operation for issuing alarms is required.

Further, although an issuing time of a signal disconnection alarm is not particularly defined by ITU, the Bellcore standard requires alarm-issuing at 2.3 s to 100 s of a data signal-off. In this case, in consideration of the switching of a cross-connecting apparatus or the like and continuation of the same symbol, it is required that a signal disconnection alarm should not be issued within 2.3 s of a data signal-off.

In an example of a conventional signal-off detection circuit for issuing such a signal disconnection alarm, there is a configuration shown in FIG. 12A. Referring to FIG. 12A and FIG. 12B showing operating waveforms of the circuit of FIG. 12A, the configuration is as follows. An input data signal is converted from an optical signal to an electrical signal, which is amplified to a fixed amplitude by an amplifier 20. Then, waveforms of the input data signal in the lower side than a direct current offset voltage Vdc are folded back to the upper side in a full-wave rectifying circuit 30, thus providing a peak value of the data signal, and the peak value is detected in a peak value detecting circuit 31. If the detected peak value is equal to or less than a reference voltage of a comparator 32, a signal disconnection alarm is issued.

By the way, the direct current offset voltage Vdc added to the input of the amplifier 20 is generated by a direct current feedback circuit 21, wherein the offset voltage Vdc is assumed to be the direct current component of the output of the amplifier 20.

Also, another example of the signal-off detection circuit is disclosed in Japanese Patent Laid-Open No. 5-91148, and its configuration is shown in FIG. 13 and examples of its operation wave forms are shown in FIG. 14. In FIG. 13, an interval generation circuit 1 generates a monitoring interval signal S2 from an input signal S1 and outputs it to a flip flop (D-type F F) 2A, and at the same time, outputs a signal S5 having the same period as the interval signal S2 to a flip flop (D-type F F) 3A.

In the flip flop 2A, based on the monitoring interval signal S2 input thereto, a signal pulse to-be-monitored S3 within the time between the monitoring interval signals is detected, and a detection signal S4 of the detection result is output to a judgement flip flop 3A. The judgement flip flop 3A is configured to examine the state of the detection signal S4 for each of the monitoring interval times and output a signal-off detection information S6.

In the signal-off detection circuit having such a configuration, the interval generation circuit 1 divides the input signal S1 to generate a monitoring interval signal S2 such as shown in a timing chart of FIG. 14, and then outputs the signal S2 to the flip flop 2A and, at the same time, outputs a judgement signal S5 having the same period as the interval signal S2 to the flip flop 3A.

In the flip flop 2A, due to the input of the monitoring interval signal S2, when the interval signal S2 is "L", initialization is performed in a unit of the interval. "H" is always input to the data terminal of the flip flop 2A. When at least one pulse of the signal to-be-monitored S3 is input within the interval time after the initialization, the flip flop 2A outputs the detection signal S4 of "H" showing normality of signals. On the other hand, when no signal to-be-monitored S3 is input within the interval time after the initialization, the flip flop 2A outputs the detection signal S4 of "L" showing a signal-off.

In the flip flop 3A, the detection signal S4 just before the initialization performed by the monitoring interval signal S2 is judged based on the judgement signal S5 input. Then, if normal, the signal-off detection information S6 of "H" is output, and if a signal-off is judged, the signal-off detection information S6 of "L" is output.

However, in the conventional configuration shown in FIG. 12A, the output voltage of the peak value detection circuit 31 after the signal-off converges on the offset voltage Vdc according to the time constant of the direct current feedback circuit 21, as shown in FIG. 12B. Therefore, the time of alarm-issuing depends on the time constant of the direct current feedback circuit 21. Generally, for the sake of the stability of control system, the time constant is required to be large, which is resulting in much time required from a signal-off to a signal disconnection alarm-issuing. For this reason, for a system in which the issuing time of a signal disconnection alarm is defined, design becomes difficult.

Also, in the conventional circuit configuration shown in FIG. 13, if only one pulse of the input signal S3 is input within one monitoring interval time, the flip flop 2A detects the one pulse and outputs the detection signal S4 of "H". Therefore, for a system requiring that when input signals present within this interval time are equal to or more than a certain defined number (a number more than 1), then data input is judged as being present, and when less than the number, data input is judged as being absent, the circuit of FIG. 13 can not be used.

That is, the conventional example of FIG. 13 uses a scheme in which if at least one input signal is present within the monitoring interval time, input signals is judged as being present and, otherwise, input signals is judged as being absent. Therefore, it is impossible to use the convention example of FIG. 13 for a signal-off detection circuit in an optical receiving device for receiving an optical signal. This reason is because an optical receiving device requires the fact that when the number of data signals present within a certain period is equal to or more than a defined value, data input is judged as being present, and if less than the value, data input is judged as being absent, as described above.

Also, because the configuration of the circuit of FIG. 13 judges an input signal as being present if only one pulse is input thereto, even in the case in which no input data but only noise is present within the monitoring interval time, the circuit of FIG. 13 judges that a data signal is present within the time. However, because an optical signal input to an optical receiving device includes a lot of noise components, there is a disadvantage that the circuit of FIG. 13 described above can not be used at all for a signal-off detection circuit of an optical receiving device in an optical transmission system for handling such an optical signal.

BRIEF SUMMARY OF THE PRESENT INVENTION

An object of the present invention is to provide a signal-off detection circuit allowing arbitrary setting of the issuing time (response speed) of a signal disconnection alarm without being affected by the time constant of a direct current feedback circuit for giving an offset voltage to an amplifier amplifying a data signal, and to provide an optical receiving device using the signal-off detection circuit.

Another object of the present invention is to provide a signal-off detection circuit allowing the issuing of a signal disconnection alarm when the number of data signals within a fixed time is less than a reference value, and to provide an optical receiving device using the signal-off detection circuit.

Still another object of the present invention is to provide a signal-off detection circuit allowing accurate detection of signal-off even if a noise component is included, and to provide an optical receiving device using the signal-off detection circuit.

The present invention provides a signal-off detection circuit characterized by counting input data signals per a fixed time for detecting a disconnection state of the above described data signal according to whether the count value reaches to a predetermined value (a positive integer but 1) or not.

Further, the signal-off detection circuit is characterized in that it comprises a counter for counting the above described input data signals every a fixed time, and comparing means for comparing the count value and the above described predetermined value, wherein the comparison result is used as an alarm output for a signal-off. Also, the signal-off detection circuit is characterized by further comprising means for resetting the above described counter every the above described fixed time.

Further, the signal-off detection circuit is characterized in that it comprises a counter for counting the above described input data signals every a fixed time and causing transition of its output level at the time of reaching to the above described predetermined value, a first flip flop for taking a predetermined level of the above described counter in at the timing of the output level transition thereof and holding it for the above described fixed time, and a second flip flop for taking the holding level of the first flip flop in every the above described fixed time and holding it, wherein the holding output of the second flip flop is used for an alarm output.

Furthermore, the signal-off detection circuit is characterized by further comprising means for generating a reset pulse for resetting the above described counter and the above described first flip flop every the above described fixed time, and characterized in that the above described reset pulse is used as the data-taking-in timing pulse for the above described second flip flop.

Also, the signal-off detection circuit is characterized in that it further comprises delay means for delaying the above described data-taking-in timing pulse by a predetermined time to output as the above described reset pulse. Further, the detection circuit is characterized in that it further comprises an amplifier for amplifying the above described input data signal, and a direct current feedback circuit for adding an offset voltage to the input of the amplifier, wherein the output of the above described amplifier is adapted to be counted. Also, the signal-off detection circuit is characterized in that the offset voltage caused by the above described direct current feedback circuit is changed and controlled at the time of detecting the above described signal disconnection state.

Also, the signal-off detection circuit is characterized in that the above described amplifier is to be also used for signal amplification for a data recovery circuit for performing recovery of the above described input data or it is another one independent of an amplifier for signal amplification for a data recovery circuit for performing recovery of the above described input data.

The present invention provides an optical receiving device comprising the signal-off detection circuit mentioned above.

The operation of the present invention will be described. A configuration is made such that input data signals per a fixed time may be counted by a counter, and the disconnection state of the data signal may be detected based on whether the count value reaches to a predetermined value or not, issuing a signal disconnection alarm. Thereby, it is possible to set the issuing time of a signal disconnection alarm without being affected by the time constant of a direct current feedback circuit for giving an offset voltage to an amplifier for amplifying a data signal of the preceding stage, and further the configuration is most suitable for detecting a signal disconnection of an optical signal including a lot of noise.

BRIEF DESCRIPTION OF THE DRAWINGS

FIG. 1 is a diagram for showing a configuration according to one embodiment of the present invention;

FIG. 2 is a diagram for showing an operation of a circuit of FIG. 1;

DETAILED DESCRIPTION OF THE PREFERRED EMBODIMENTS

Figure 3A:
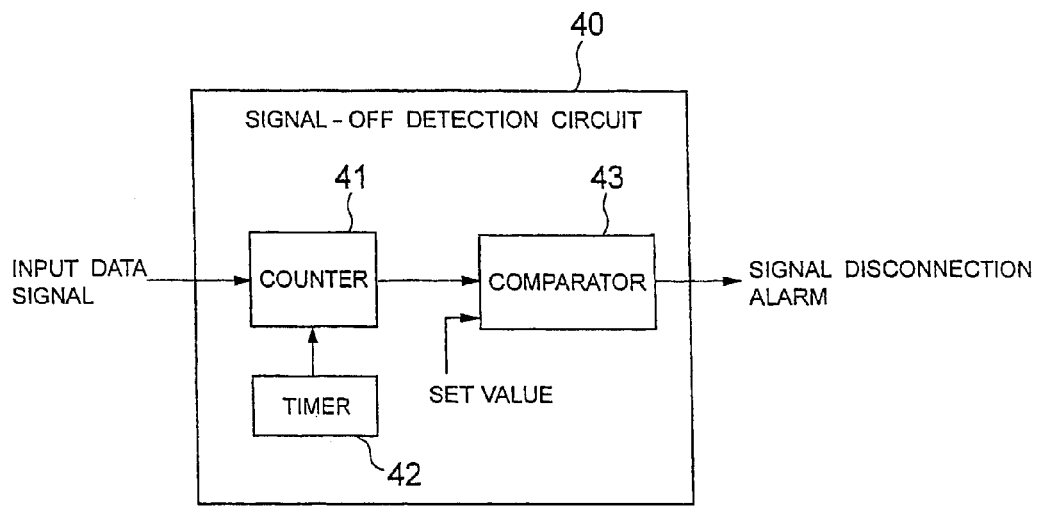
FIG. 3A and FIG. 3B are diagrams for showing a configuration and an operation of another embodiment of the present invention.

Hereinafter, embodiments of the present invention will be described with reference to drawings. FIG. 1 is a diagram for showing a configuration according to a first embodiment of the present invention. As shown in FIG. 1, a signal-off detection circuit 10 comprises a counter 11, a D flip flop 12, a D flip flop 13, and a delay device 14.

The counter 11 counts the number of "1" data signals of an input data signal within a predetermined time, wherein the input data signal is converted from an optical signal to an electrical signal which is amplified to a predetermined amplitude through an amplifier such as an AGC amplifier and a limiter amplifier. When the number of the "1" data signals or the rising edges of the data signals becomes equal to or more than a predetermined number (a positive integer greater than 1), the counter 11 outputs "1".

The D flip flop 12 reads "1" at its data terminal D in every time the counter 11 outputs a "1" output, and outputs "1" to the data terminal D of the D flip flop 13. The D flip flop 13 reads the output of the D flip flop 12 in and outputs it every time a bit is output from a reset pulse. When no input of "1" data signals or no rising edge of the data signals is present, the output of the D flip flop 12 becomes "0", and the D flip flop 13 outputs "0" as a signal disconnection alarm.

The delay device 14 is inserted in order to ensure an order relation that it resets the counter 11 and the D flip flop 12 directly after the D flip flop 13 has read the output of the flip flop 12 in. Provided that the order relation between reading-in and resetting is reliably performed, the delay device 14 can be particularly eliminated.

With reference to FIG. 2, the issuing/releasing of a signal disconnection alarm will be described. At a time T1, as soon as the output of the counter 11 is reset by a reset pulse, the counter 11 starts counting "1" data signals of an input signal or the rising edges of the data signals. When the count value reaches to a predetermined number of "1" data signals or the rising edges of the data signals, the counter 11 outputs "1". The D flip flop 12 reads "1" at its data terminal in at the point of change at which the output of the counter 11 changes from "0" to "1", and holds a "1" output until a reset pulse of a time T2 comes.

The D flip flop 13 reads the output of the D flip flop 12 at the time T1, but if the state before the time T1 is not of a input signal disconnection, the output of the D flip flop 12 is "1", and therefore the D flip flop 13 does not issue a signal disconnection alarm.

Between the time T1 and the time T2, "1" data signals or the rising edges of the data signals equal to or more than a predetermined number are present in the input data signal of this time period. Therefore, the output of the counter 11 changes from "0" to "1", and the output of the D flip flop 12 becomes "1" and holds the "1" output until the reset pulse of the time T2 comes. Since the output of the D flip flop 12 directly before the time T2 is "1", the output of the D flip flop 13 becomes "1" at the time T2, and thus a signal disconnection alarm is not issued.

Between the time T2 and a time T3, because there is no input data signal in this period, the output of the counter 11 and the output of the D flip flop 12 remain "0". At the time T3, the D flip flop 13 reads the output "0" of the D flip flop 12 in and outputs "0", issuing a signal disconnection alarm.

Figure 13:
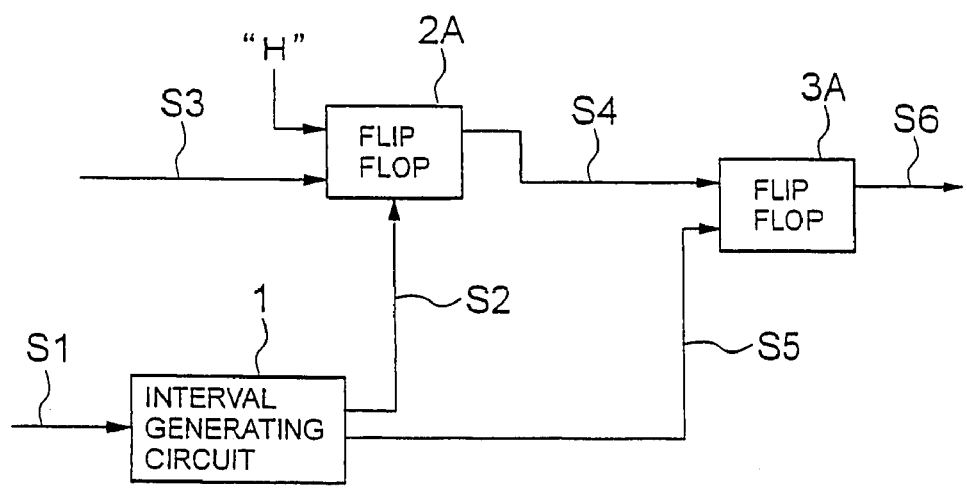
FIG. 13 is a diagram for showing another example of conventional related art.
Figure 14:
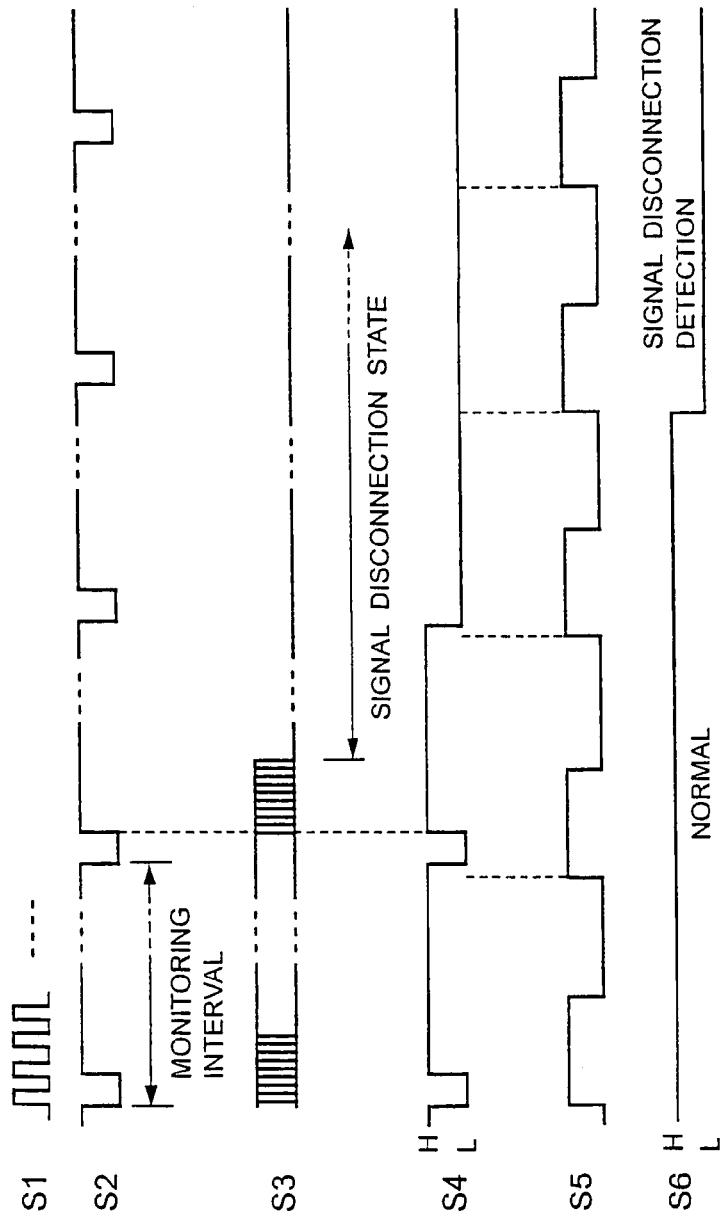
FIG. 14 is a diagram for showing an operation of the circuit of FIG. 13.

Between the time T3 and a time T4, although there are a few input data signals in this period, the number of "1" data signals or the rising edges of the data signals are less than a predetermined number. For this reason, the output of the counter 11 and the output of the D flip flop 12 remain "0". At the time T4, the D flip flop 13 also reads "0" at the output of the D flip flop 12 in and outputs "0", thus issuing a signal disconnection alarm. Such a situation is considered to be caused by the occurrence of noise rather than normal input data signals, and thus a signal disconnection alarm should not be released (by the way, in the conventional example of FIG. 13, on occurrence of noise, clearly the flip flop 2A detects this noise and judges that data is present).

Between the Time T4 and a time T5, when the input data signal returns, the output of the counter 11 and the output of the D flip flop 12 both become "1" and, at the time T5, the D flip flop 13 reads the output "1" at the output of the D flip flop 12 in and outputs "1", thus releasing the signal disconnection alarm.

In this way, only changing the period of reset pulses permits the alarm-issuing time to be arbitrarily set. Also, because the criterion for judging the normality of a signal is that "1" data signals or the rising edges of the data signals equal to or more than a predetermined number are included within a fixed time, the judging is less affected by noise, and thus the operation of judgement becomes reliable.

FIG. 3A shows an example of a configuration according to a second embodiment of the present invention, in which the parts equal to those of FIG. 1 are indicated by the same symbols. A signal-off detection circuit 40 according to the present embodiment comprises a counter 41, a timer 42, and a comparator 43. The counter 41 counts the number of "1" data signals of an input data signal for a fixed time determined by the timer 42, wherein the input data signal is converted from an optical signal to an electrical signal which is amplified to a predetermined amplitude. The counter 41 is reset after the elapse of the fixed time, and starts the above counting for a fixed time re-determined by the timer 42.

The timer 42 gives a counting time of the counter 41 and resets the counter 41 after the elapse of a set time. When the number of "1" data signals or the rising edges of the data signals counted by the counter 41 is equal to or less than a predetermined number (set value: a positive integer greater than 1), the comparator 43 issues a signal disconnection alarm.

Instead of counting "1" data signals or the rising edges of the data signals, the number of "0" data signals may be counted. In this case, the comparator 43 is to issue an alarm when the number of "0" data signals is equal to or more than a predetermined number.

Figure 3B:
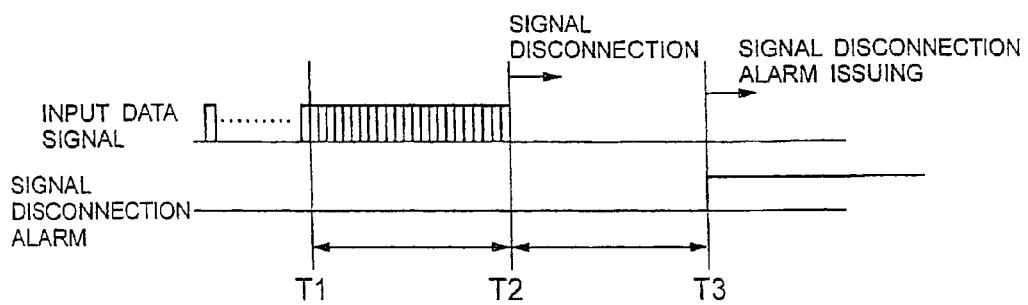

The operation of the second embodiment will be described with reference to FIG. 3B. An input data signal, converted from an optical signal to an electrical signal and amplified to a certain amplitude by an AGC amplifier or a limiter amplifier, is input to a signal-off detection circuit 40. The counter 41 of the signal-off detection circuit 40 starts counting the number of "1" data signals of the input data signal or the rising edges of the data signals at a time T1, and ends the counting at a time T2, and outputs the count result to the comparator 43.

In the comparator 43, the number of "1" data signals or the rising edges of the data signals counted by the counter 41 is compared with a predetermined set value (a positive integer but 1), and if the number is equal to or more than the set value, a signal disconnection alarm is not issued. At the time T2, the timer 42 resets the counter 41, and the counter 41 again starts counting the number of "1" data signals or the rising edges of the data signals. Between the time T2 and a time T3, because none of "1" data signals or the rising edges of the data signals are present, the number of "1" data signals or the rising edges of the data signals becomes equal to or less than the set value of the comparator 43, and thus a signal disconnection alarm is issued.

Figure 4:
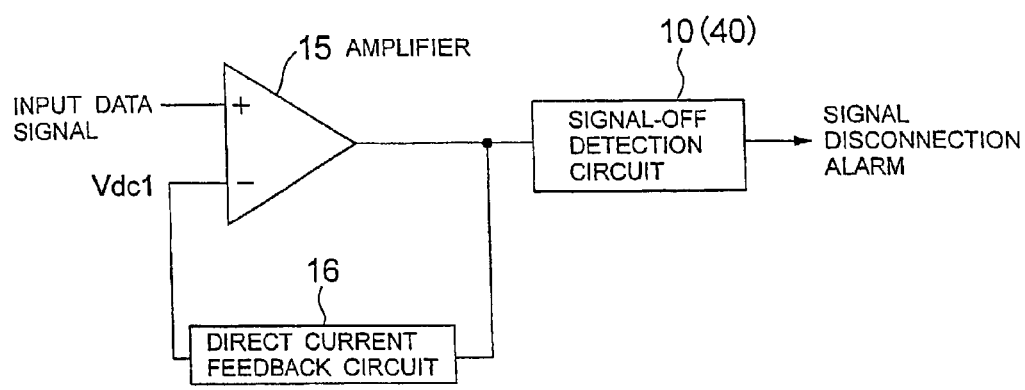
FIG. 4 is a diagram for showing an example of application of the embodiment of the present invention.

FIG. 4 shows an example of a configuration when the signal-off detection circuits of FIG. 1 and FIG. 3A mentioned above are used with an AGC amplifier and a limiter amplifier. An amplifier 15 is for supplying a data signal having a predetermined amplitude to the signal-off detection circuit 10 or 40. An AGC amplifier and a limiter amplifier are often used for the amplifier 15. A direct current feedback circuit 16 detects a direct current component of the output of the amplifier 15 and feeds back it to the input of the amplifier 15 as an offset voltage Vdc1, giving a point of operation of the amplifier 15. Also, the feedback circuit 16 prevents the noise from being input to the signal-off detection circuit by adjusting the offset voltage Vdc1. The noise is caused during loss of data signals.

The signal-off detection circuit 10 or 40 is to issue a signal disconnection alarm when the number of data signals present within a fixed time is below a reference value, and it has the configuration shown in FIG. 1 or FIG. 3A.

Figure 5:
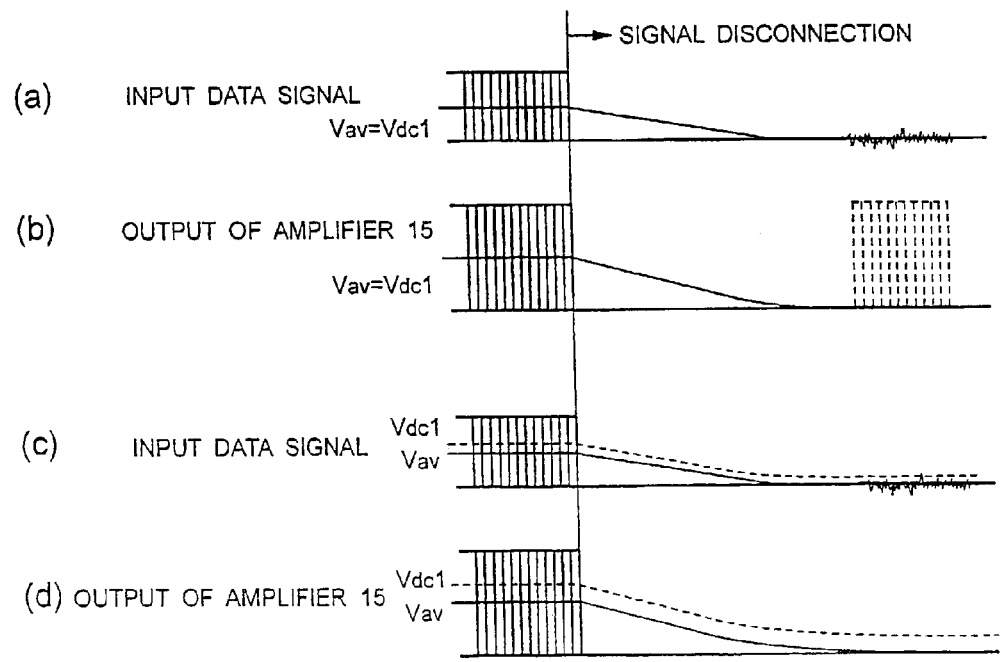
FIG. 5 is a diagram for showing an operation of the circuit of FIG. 4.

FIG. 5 is a diagram for showing an operation of the circuit of FIG. 4. When the data signal is lost, the average value Vav of the input data signal converges on the "L" level of the data signal according to the time constant of the direct current feedback circuit 16 (time constant for detecting the direct current component of the data signal). If the offset voltage Vdc1 added to the input data signal is equal to the average value Vav of the input data signal, and when only a little amount of noise is superimposed on the input terminal of the amplifier 15 (see FIG. 5(a)), the amplifier 15 amplifies the noise (see FIG. 5(b)). If the noise amplified by the amplifier 15 becomes equal to or larger than a certain value in amplitude, the signal-off detection circuit 10 or 40 counts it as a data signal, resulting in a malfunction.

Therefore, in order to prevent this, an offset voltage Vdc1 a little larger than the level of noise during disconnection of data signals is given to the input of the amplifier 15 (see FIG. 5(c)). Thereby, it is possible to prevent noise from being output from the amplifier 15 (see FIG. 5(d)), permitting the reliable issuing of a signal disconnection alarm.

Figure 6:
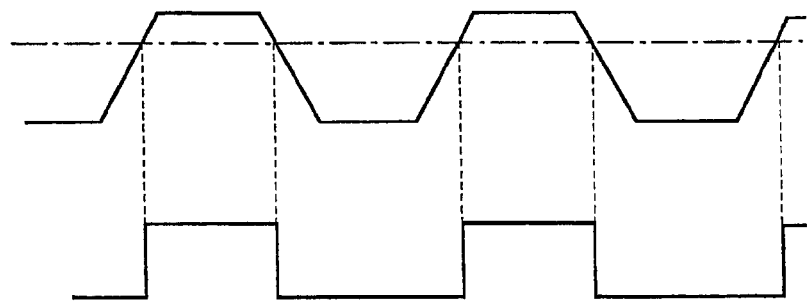
FIG. 6 is a diagram for illustrating degradation in an occupancy rate of a data signal associated with an increase in an offset voltage.
Figure 10:
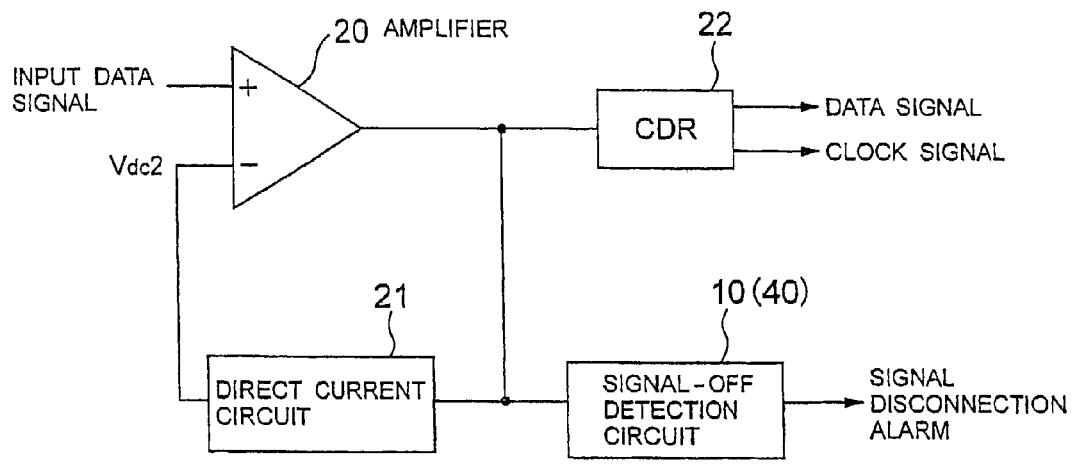
FIG. 10 is a diagram for showing still another example of application of the embodiment of the present invention.

By the way, in this case, making the offset voltage Vdc1 large permits reliable preventing of malfunction of the signal-off detection circuit. However, in optical receiving devices, generally the output of the amplifier 20 is divided into two parts, and the output is also input to a clock and data recovery circuit (CDR: clock and data recovery circuit) 22 in addition to being input to the signal-off detection circuit, as also shown in FIG. 10 mentioned later. Therein, when the offset voltage Vdc1 is made large, the discrimination level in the clock and data recovery circuit also becomes larger. At this time, since the upper side portion of the waveform of a data signal shown in the upper side of FIG. 6 is recognized as the high level of the data in the clock and data recovery circuit, when the discrimination level shown by a long dashed short dashed line becomes large, the occupancy rate of the high level becomes small as shown in the lower side of the drawing, resulting in worsening of duty ratio. Therefore, the offset voltage Vdc1 during loss of data signals is desirably limited to a value a little larger than the level of noise.

Figure 7:
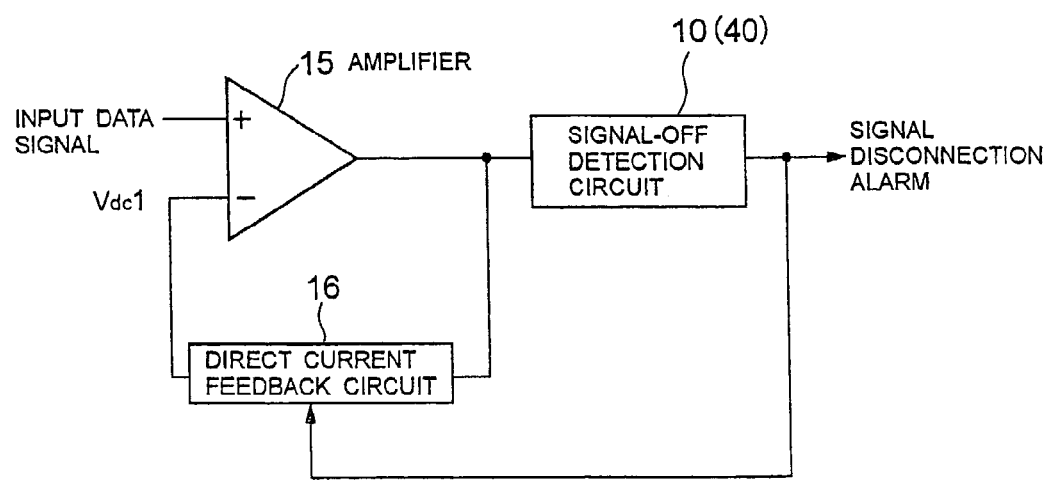
FIG. 7 is a diagram for showing another example of application of the embodiment of the present invention.

FIG. 7 shows another example of a configuration when the signal-off detection circuits of FIG. 1 and FIG. 3A mentioned above are used with an AGC amplifier and a limiter amplifier. An amplifier 15 is for supplying a data signal having a predetermined amplitude to the signal-off detection circuit. An AGC amplifier and a limiter amplifier are often used for the amplifier 15. A direct current feedback circuit 16 detects a direct current component of the output of the amplifier 15 and feeds back it to the input of the amplifier 15 as an offset voltage Vdc1, giving a point of operation of the amplifier 15. Also, the feedback circuit 16 prevents the noise from being input to the signal-off detection circuit by adjusting the offset voltage. The noise is caused during loss of data signals.

Further, when the direct current feedback circuit 16 receives a signal disconnection alarm from the signal-off detection circuit 10 or 40, it gives an offset voltage V2 to the input of the amplifier 15, whereby even if larger noise occurs, it prevents the noise from inputting to the signal-off detection circuit. Further, the signal-off detection circuit 10 or 40 is to issue a signal disconnection alarm when the number of data signals present within a fixed time is less than a reference value, and it is shown in FIG. 1 or FIG. 3A.

Figure 8:
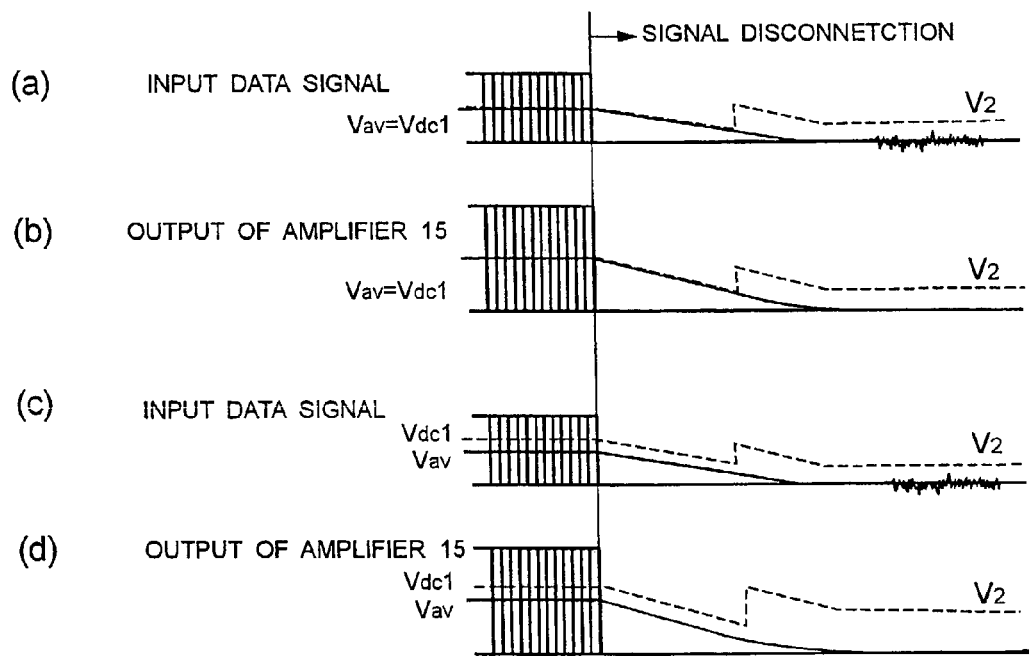
FIG. 8 is a diagram for showing an operation of the circuit of FIG. 7.

FIG. 8 is a diagram for showing the operation of the circuit of FIG. 7. When the signal-off detection circuit 10 or 40 detects a signal-off, an offset voltage V2 is given to the input of the amplifier 15 to prevent noise from inputting to the signal-off detection circuit even if larger noise occurs. That is, when a data signal is lost, the average value Vav of the input data signal converges on the "L" level of the data signal under the influence of the time constant of the direct current feedback circuit 16.

When the offset voltage Vdc1 given to an input data signal is equal to the average value Vav of the input data signal, the offset voltage Vdc1 tends to converge on the "L" level of the data signal together with the average value Vav of the input data signal. However, when the signal-off detection circuit 10 or 40 detects a signal-off before the offset voltage Vdc1 converges on the "L" level of the data signal and it issues a signal disconnection alarm, the direct current feedback circuit 16 gives the offset voltage V2 to the input of the amplifier 15 (see FIG. 8(a)). For this reason, if the magnitude of noise is less than V2, no noise is output by the amplifier 15 (see FIG. 8(b)).

Usually, at the time of issuing a signal disconnection alarm, data and clocks are often inhibited from being output from an optical receiving circuit. Therefore, worsening of the occupancy rate (duty ratio) of the data signal is not so much concerned. Also, as in the configuration of FIG. 4, an offset voltage Vdc1 a little larger than the level of noise during disconnection of data signals is given to the amplifier 15 (see FIG. 8(c)), and at the time of a signal disconnection alarm-issuing, the offset voltage V2 may be further added to it (see FIG. 8(d)).

Figure 9:
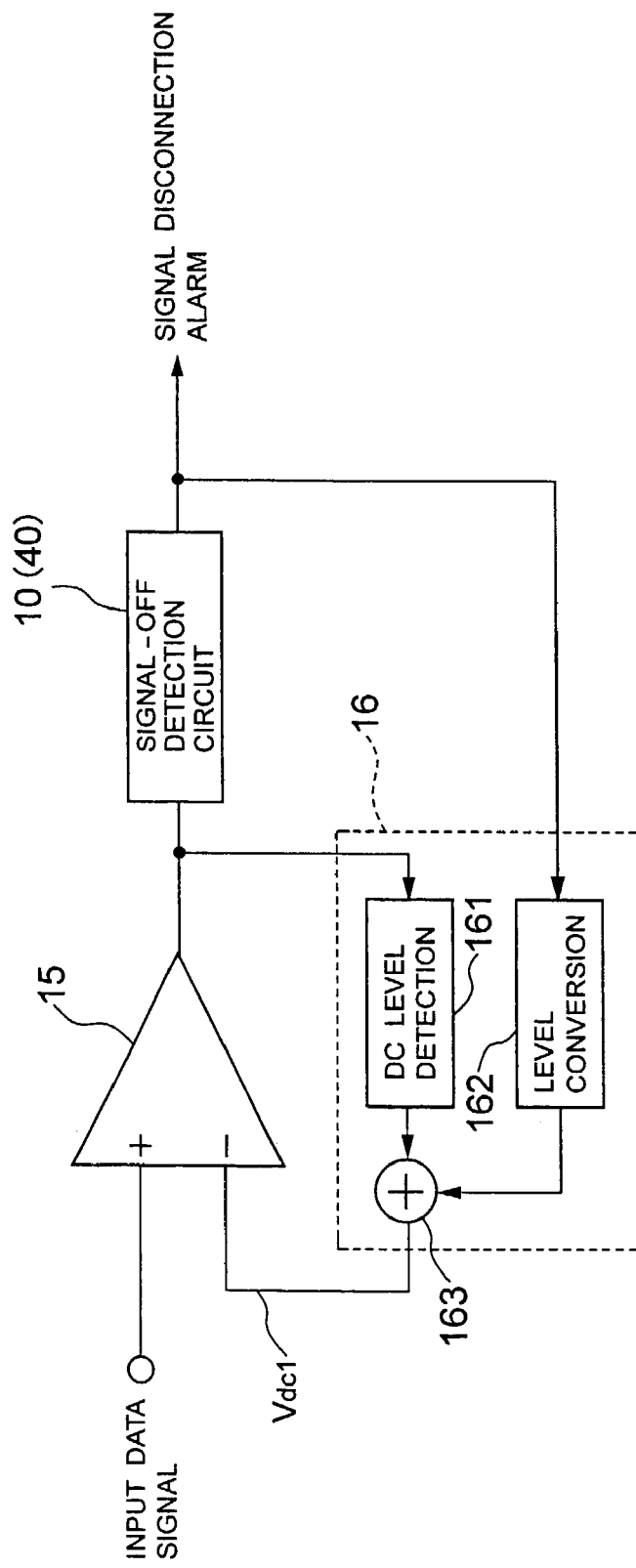
FIG. 9 is a diagram for showing an example of a direct current feedback circuit of FIG. 7.

FIG. 9 is a diagram for showing the outline of configuration of the direct current feedback circuit 16 of FIG. 7, which comprises a DC level detection portion 161 for detecting the direct current component of the output of the amplifier 15, a level conversion portion 162 for converting the alarm output of the signal-off detection circuit 10 (40) to a predetermined level and outputting it, and an adder 163 for adding these outputs. The added output is fed back to the amplifier 15 as the offset voltage Vdc1.

FIG. 10 is a diagram for showing one example of an optical receiving device incorporating the signal-off detection circuit 10 or 40. A signal, converted from an optical signal to an electrical signal and amplified by an amplifier 20 such as an AGC amplifier and a limiter amplifier, is input to a clock and data recovery circuit (CDR) CDR 22 and also input to the signal-off detection circuit 10 or 40. A direct current feedback circuit 21 feeds back the direct current component of the input data signal to the input side of the amplifier 20 to give the offset voltage Vdc1 thereto.

The CDR 22 adopts a well known circuit configuration in which a clock is extracted by a PLL (phase locked loop) circuit and the extracted clock is used to perform recovery of data.

Figure 11:
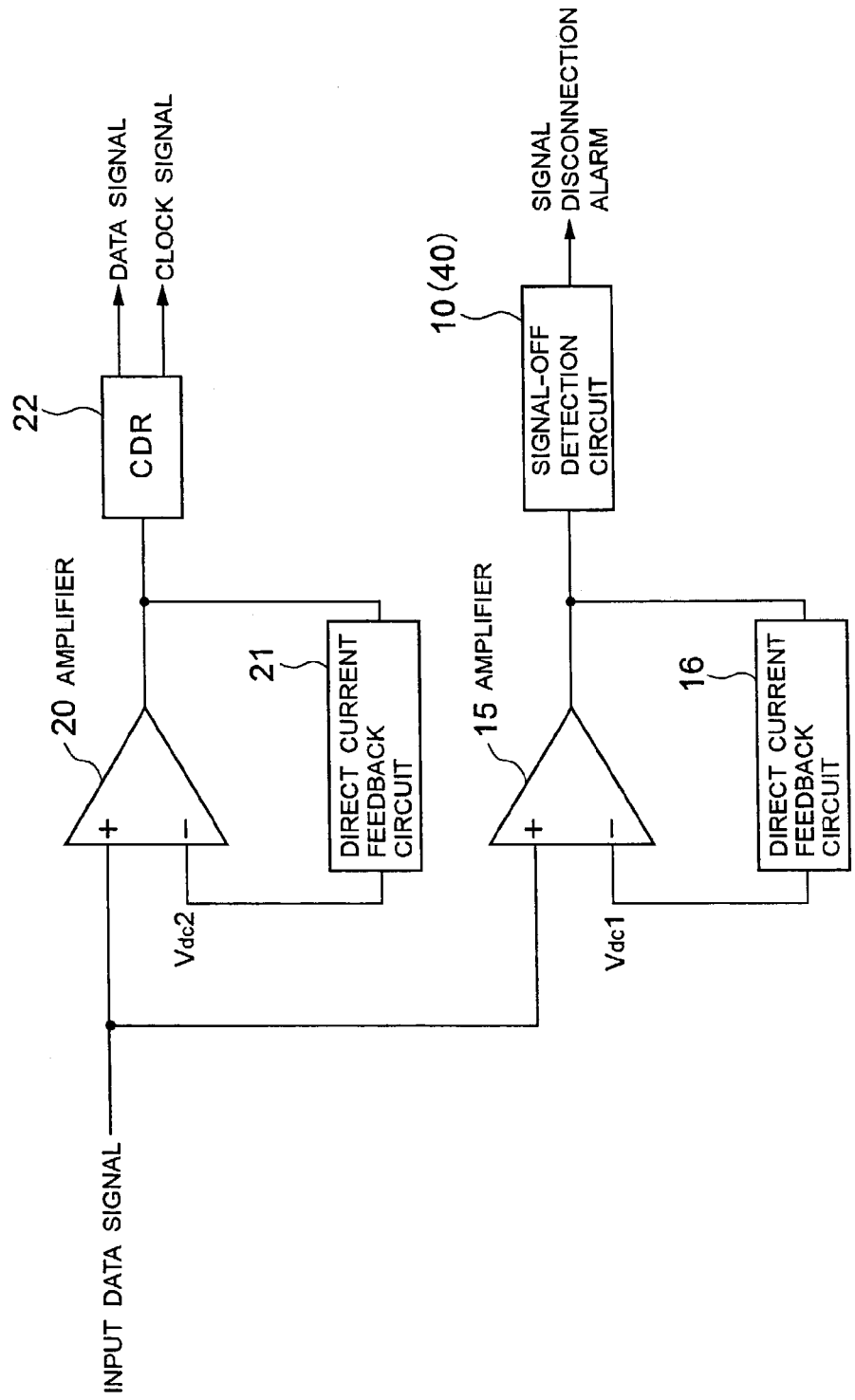
FIG. 11 is a diagram for showing yet another example of application of the embodiment of the present invention.
Figure 12A:
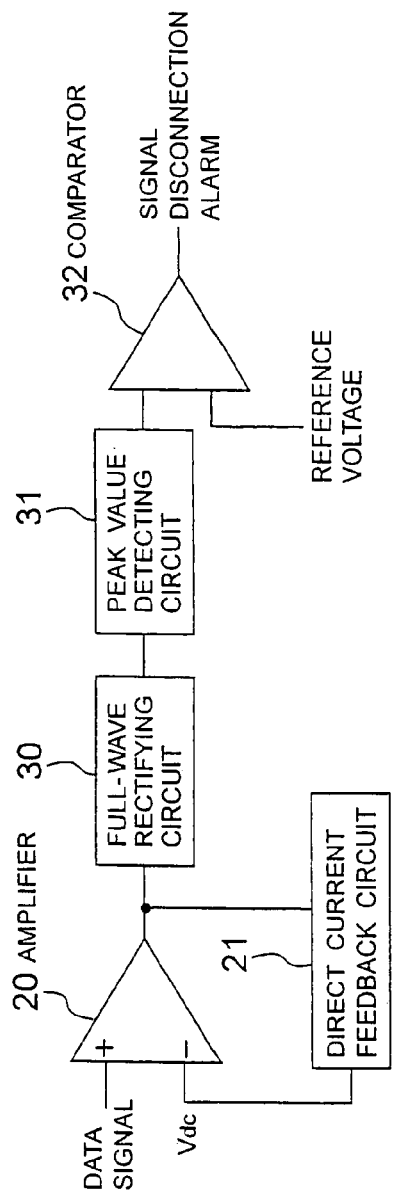
FIG. 12A and FIG. 12B are diagrams for illustrating one example of conventional related art.
Figure 12B:
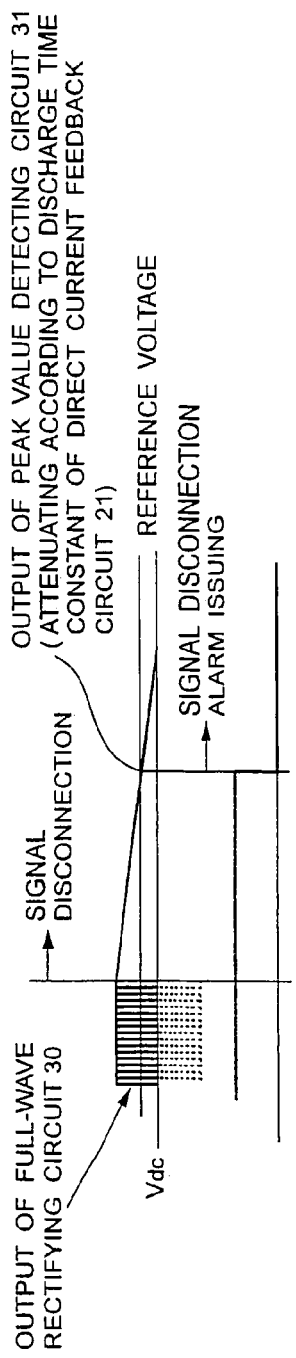

FIG. 11 is a diagram for showing yet another example of an optical receiving device incorporating the signal-off detection circuit 10 or 40, indicating the parts equal to those of FIG. 10 with the same symbols. In the present example, a signal, converted from an optical signal to an electrical signal and amplified by an amplifier 20 such as an AGC amplifier and a limiter amplifier, is input to a clock and data recovery circuit (CDR) CDR 22. Also, the amplifier 15 is provided therein. An input data signal, converted from an optical signal to an electrical signal and amplified by an amplifier 15, is input to the signal-off detection circuit 10 or 40. The direct current feedback circuit 16 feeds back the direct current component of the input data signal to the input side of the amplifier 15, giving an offset voltage Vdc2 thereto.

By using the configuration of FIG. 11, the offset voltage for the amplifier 15 for supplying the input data to the signal-off detection circuit 10 or 40, and the offset voltage given to the amplifier 20 for supplying the input data to the clock and data recovery circuit (CDR) 22 each can be controlled independently of each other, thereby providing each offset voltage allowing optimal operation of each circuit. Also, in case of actively controlling the offset voltage Vdc2 given to the amplifier 20 to optimize the discrimination threshold value for the clock and data recovery circuit (CDR) 22, the signal-off detection circuit is advantageously not affected by variations in the offset voltage Vdc2 of the amplifier 20.

Each circuit configuration shown in the above described embodiment is advantageously used for an optical receiving device in the transmission system for optical signals including a lot of noise. In this case, since the optical receiving device is configured to be integrated into a LSI circuit and is configured as a logic circuit configuration, its integration to an IC is easy.

As described hereinbefore, according to the present invention, there is provided an advantage that the issuing time (response time) of a signal disconnection alarm can be arbitrarily set without being affected by the time constant of a direct current feedback circuit giving an offset voltage to an amplifier for amplifying an input data signal. That is, it is possible to advance the issuing time of an alarm. Also, since the circuit can be configured only by a logic IC, there is also an advantage that the setting of the issuing time of an alarm becomes easy. Also, it is a judgement criterion for the normality of a signal that "1". data signals or the rising edges of the data signals equal to or more than a predetermined number are included within a fixed time. Therefore, there is provided an advantage that the setting is less affected by noise and the setting operation is reliable.

What is claimed is:

1. A signal-off detection circuit counting input data signals per a fixed time for detecting a disconnection state of said data signal according to whether the count value reaches a predetermined value (a positive integer greater than 1), the circuit comprising:

a counter for counting said input data signals every fixed time and causing transition of its output level when reaching to said predetermined value;

a first flip flop taking a predetermined level of said counter at the timing of the output level transition thereof and holding it for said fixed time;

a second flip flop taking the holding level of the first flip flop every said fixed time and holding it;

means for generating a reset pulse for resetting said counter and said first flip flop every said fixed time;

delay means for delaying a data-taking-in timing pulse by a predetermined time to output as said reset pulse;

wherein the holding output of the second flip flop is used for an alarm output, and wherein said data-taking-in timing pulse is also used as the data-taking-in timing pulse for said second flip flop.

2. An optical receiving device comprising the signal-off detection circuit according to claim 1.

3. The optical receiving device according to claim 2, which is configured to be integrated as a LSI circuit.

4. A signal-off detection circuit counting input data signals per a fixed time for detecting a disconnection state of said data signal according to whether the count value reaches a predetermined value (a positive integer greater than 1), the circuit comprising:

an amplifier for amplifying said input data signal;

a direct current feedback circuit for adding an offset voltage to the input of the amplifier;

a counter for counting said input data signals every fixed time and causing transition of its output level when reaching to said predetermined value;

a first flip flop taking a predetermined level of said counter at the timing of the output level transition thereof and holding it for said fixed time;

a second flip flop taking the holding level of the first flip flop every said fixed time and holding it;

means for generating a reset pulse for resetting said counter and said first flip flop every said fixed time; and delay means for delaying said data-taking-in timing pulse by a predetermined time to output as a data-taking-in timing pulse, wherein the output of said amplifier is adapted to be counted, wherein the holding output of the second flip flop is used for an alarm output, and wherein said data-taking-in timing pulse is also used as the data-taking-in timing pulse for said second flip flop.

5. The signal-off detection circuit according to claim 4, wherein the offset voltage caused by said direct current feedback circuit is changed and controlled at the time of detecting said disconnection state.

6. The signal-off detection circuit according to claim 4, wherein said amplifier is also used for signal amplification for a data recovery circuit for performing recovery of said input data.

7. The signal-off detection circuit according to claim 4, wherein said amplifier is another one independent of an amplifier for signal amplification for a data recovery circuit for performing recovery of said input data.

* * * * *